(12) United States Patent
Tsai et al.

(10) Patent No.: US 10,790,162 B2
(45) Date of Patent: Sep. 29, 2020

(54) INTEGRATED CIRCUIT PACKAGE AND METHOD

(71) Applicant: Taiwan Semiconductor Manufacturing Company, Ltd., Hsinchu (TW)

(72) Inventors: Po-Hao Tsai, Zhongli (TW); Techi Wong, Zhubei (TW); Meng-Wei Chou, Zhubei (TW); Meng-Liang Lin, Hsinchu (TW); Po-Yao Chuang, Hsinchu (TW); Shin-Puu Jeng, Po-Shan Village (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/207,850

(22) Filed: Dec. 3, 2018

(65) Prior Publication Data

US 2020/0105663 A1 Apr. 2, 2020

Related U.S. Application Data

(60) Provisional application No. 62/737,246, filed on Sep. 27, 2018.

(51) Int. Cl.
*H01L 21/56* (2006.01)
*H01L 23/522* (2006.01)
(Continued)

(52) U.S. Cl.
CPC .......... *H01L 21/563* (2013.01); *H01L 21/56* (2013.01); *H01L 21/76871* (2013.01); *H01L 21/76877* (2013.01); *H01L 23/3121* (2013.01); *H01L 23/49827* (2013.01); *H01L 23/5226* (2013.01); *H01L 24/09* (2013.01); *H01L 24/14* (2013.01); *H01L 2224/02372* (2013.01); *H01L 2224/0401* (2013.01)

(58) Field of Classification Search
CPC ....... H01L 23/3135; H01L 2924/15151; H01L 2924/15153; H01L 2224/023–024; H01L 21/56; H01L 2924/181–183; H01L 23/31; H01L 23/3107; H01L 23/3121; H01L 23/3128
See application file for complete search history.

(56) References Cited

U.S. PATENT DOCUMENTS 8,704,365 B2 * 4/2014 Park .................... H01L 23/3128
257/724
8,993,380 B2 3/2015 Hou et al.
(Continued)

*Primary Examiner* — Scott B Geyer
(74) *Attorney, Agent, or Firm* — Slater Matsil, LLP

(57) ABSTRACT

In an embodiment, a package includes: a first redistribution structure; a first integrated circuit die connected to the first redistribution structure; a ring-shaped substrate surrounding the first integrated circuit die, the ring-shaped substrate connected to the first redistribution structure, the ring-shaped substrate including a core and conductive vias extending through the core; a encapsulant surrounding the ring-shaped substrate and the first integrated circuit die, the encapsulant extending through the ring-shaped substrate; and a second redistribution structure on the encapsulant, the second redistribution structure connected to the first redistribution structure through the conductive vias of the ring-shaped substrate.

20 Claims, 21 Drawing Sheets

(51) Int. Cl.
   *H01L 23/498* (2006.01)
   *H01L 23/31* (2006.01)
   *H01L 23/00* (2006.01)
   *H01L 21/768* (2006.01)

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,134,711 B2 * | 11/2018 | Lin | H01L 21/50 |
| 2008/0128865 A1 * | 6/2008 | Chia | H01L 23/49816 257/620 |
| 2009/0243065 A1 * | 10/2009 | Sugino | H01L 23/16 257/686 |
| 2011/0024899 A1 * | 2/2011 | Masumoto | H01L 23/49827 257/737 |
| 2014/0070396 A1 * | 3/2014 | Kyozuka | H01L 24/19 257/698 |
| 2014/0360765 A1 * | 12/2014 | Kiwanami | H01L 23/49822 174/260 |
| 2015/0001708 A1 * | 1/2015 | Lin | H01L 23/49811 257/737 |
| 2015/0062848 A1 * | 3/2015 | Lee | H05K 3/4697 361/761 |
| 2016/0276311 A1 * | 9/2016 | Meyer | H01L 21/568 |
| 2016/0336296 A1 | 11/2016 | Jeong et al. | |
| 2016/0338202 A1 * | 11/2016 | Park | H01L 23/5389 |
| 2017/0278812 A1 * | 9/2017 | Lee | H01L 23/49816 |
| 2018/0076147 A1 | 3/2018 | Kim et al. | |
| 2018/0082933 A1 * | 3/2018 | Ko | H01L 23/562 |
| 2018/0096941 A1 * | 4/2018 | Kim | H01L 23/295 |
| 2019/0131242 A1 * | 5/2019 | Lee | H01L 23/3128 |

* cited by examiner

INTEGRATED CIRCUIT PACKAGE AND METHOD

PRIORITY CLAIM AND CROSS-REFERENCE

This application claims the benefit of U.S. Provisional Application No. 62/737,246, filed on Sep. 27, 2018, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
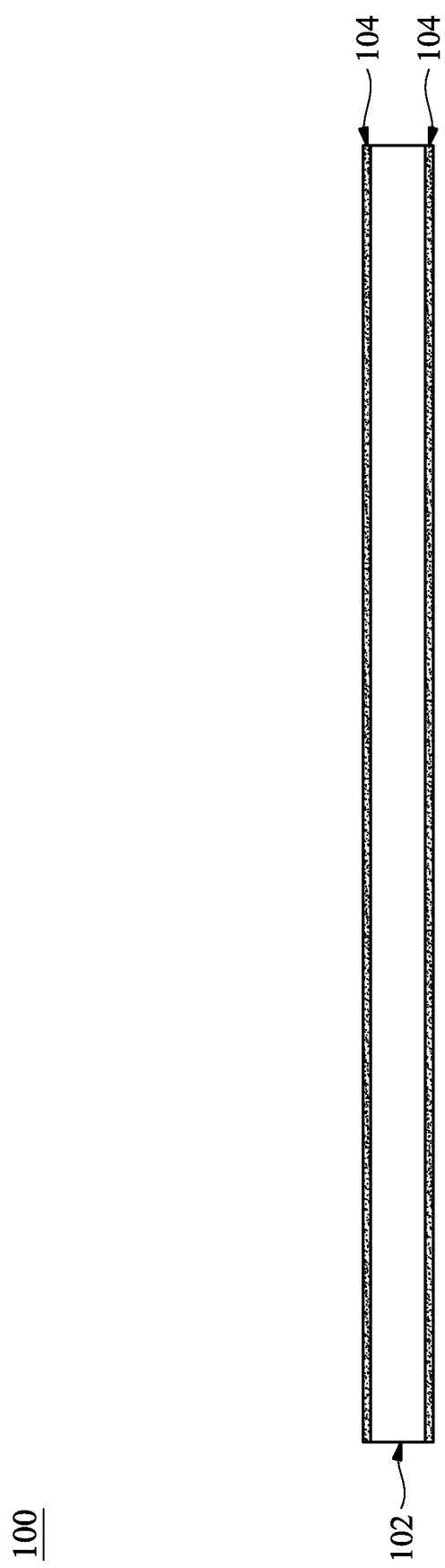
FIGS. 1 through 7B are cross-sectional views of intermediate steps of a process for forming a ring-shaped substrate, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a ring-shaped substrate is formed or provided. The ring-shaped substrate includes a substrate core having conductive lines and vias. A cavity in the ring-shaped substrate may accommodate a semiconductor device, such as an integrated circuit die. The ring-shaped substrate may then be packaged, with the package including an integrated circuit die disposed in the cavity. The package is encapsulated with, e.g., a molding compound. Because the ring-shaped substrate is rigid, it provides mechanical support when forming the package. By avoiding coefficient of thermal expansion (CTE) mismatch between the encapsulant and other components of the package, warpage may be reduced and overall stacking height of the package may be decreased.

FIGS. 1 through 7B are cross-sectional views of intermediate steps of a process for forming a ring-shaped substrate 100, in accordance with some embodiments. Although the formation of one ring-shaped substrate 100 is shown, it should be appreciated that multiple ring-shaped substrates 100 may be simultaneously formed using a same wafer or substrate, and may be subsequently singulated to form individual ring-shaped substrates 100.

In FIG. 1, a substrate core 102 having seed layers 104 on opposing sides is provided. The substrate core 102 may be formed from a pre-impregnated composite fiber ("prepreg"), an insulating film or build-up film, paper, glass fiber, non-woven glass fabric, silicon, or the like. The substrate core 102 is formed from materials that help achieve a CTE match with silicon. In some embodiments, the substrate core 102 is formed from a prepreg including glass fiber and a resin. The seed layers 104 may be one or more layers of copper, titanium, nickel, aluminum, compositions thereof, or the like, and are deposited or laminated onto opposing sides of the substrate core 102. In some embodiments, the substrate core 102 and seed layers 104 are a copper-clad epoxy-impregnated glass-cloth laminate, a copper-clad polyimide-impregnated glass-cloth laminate, or the like.

Figure 2:
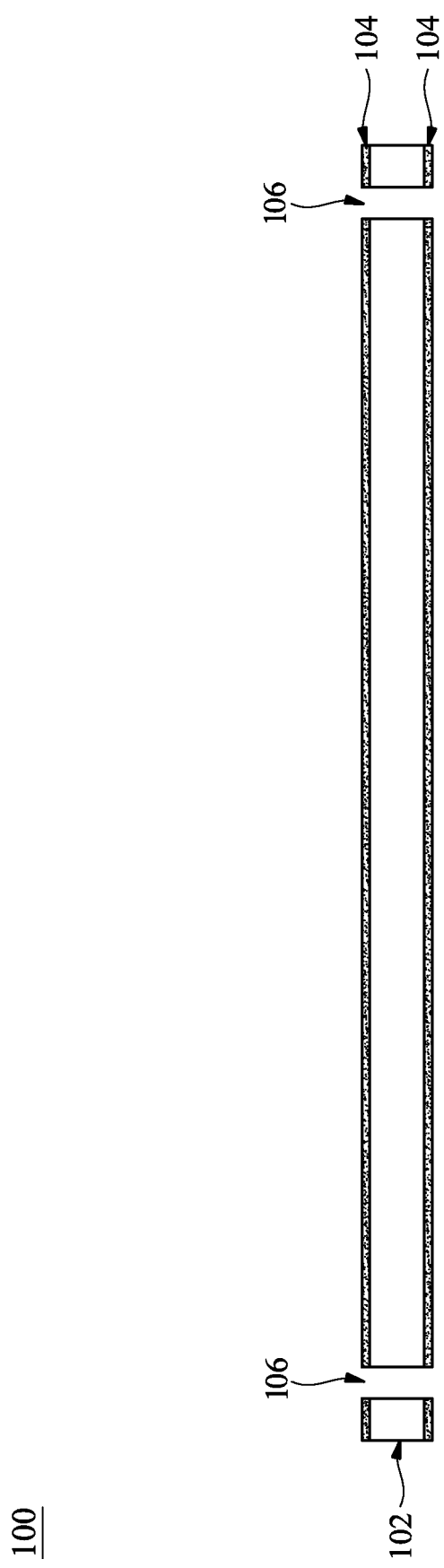

In FIG. 2, openings 106 are formed in the substrate core 102 and seed layers 104. In some embodiments, the openings 106 are formed by laser drilling. Other processes, such as mechanical drilling with a drill bit, may also be used to form the openings 106. The openings 106 may have any top-view shape, such as a polygon, a circle, or the like. A cleaning process may then be performed to clean areas near the openings 106 which may have been smeared with removed material of the substrate core 102. The cleaning process may be a desmear process. The desmearing may be accomplished mechanically (e.g., blasting with a fine abrasive in a wet slurry), chemically (e.g., rinsing with a combination of organic solvents, permanganates, and the like), or by a combination of mechanical and chemical processes.

Figure 3:
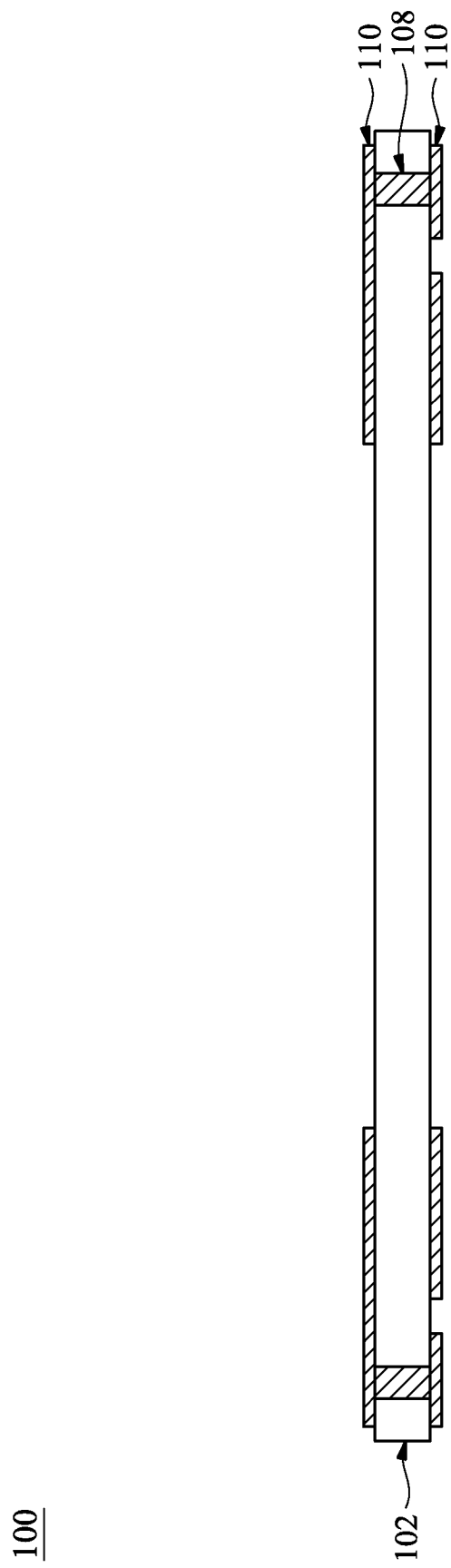

In FIG. 3, conductive vias 108 are formed in the openings 106 and conductive lines 110 are formed on opposite sides the substrate core 102. The conductive vias 108 and conductive lines 110 may be formed from a conductive material such as copper, titanium, tungsten, aluminum, or the like. The conductive vias 108 and conductive lines 110 may be formed from the same material or different materials, and may be formed by a same process or different processes. In some embodiments, the conductive vias 108 are formed with a first process and the conductive lines 110 are formed with a second process. For example, a first plating process, such as electroless plating, may be used to deposit a conductive material in the openings 106, thereby forming the conductive vias 108. In embodiments where electroless plating is used, seed layers may be formed in the openings 106. A second plating process, such as electroplating, electroless plating, or the like, may be performed using the seed layers 104. A photoresist is formed and patterned on the seed layers 104. The photoresist may be formed by spin coating or the like and may be exposed to light for patterning. The pattern of the photoresist corresponds to the conductive lines 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The photoresist and portions of the seed layers 104 on which the conductive material is not formed are removed. The photoresist may be removed by an acceptable ashing or stripping process, such as using an oxygen plasma or the like. Once the photoresist is removed, exposed portions of the seed layers 104 are removed, such as by using an acceptable etching process, such as by wet or dry etching. The remaining portions of the seed layers 104 and conductive material form the conductive lines 110.

Figure 4:
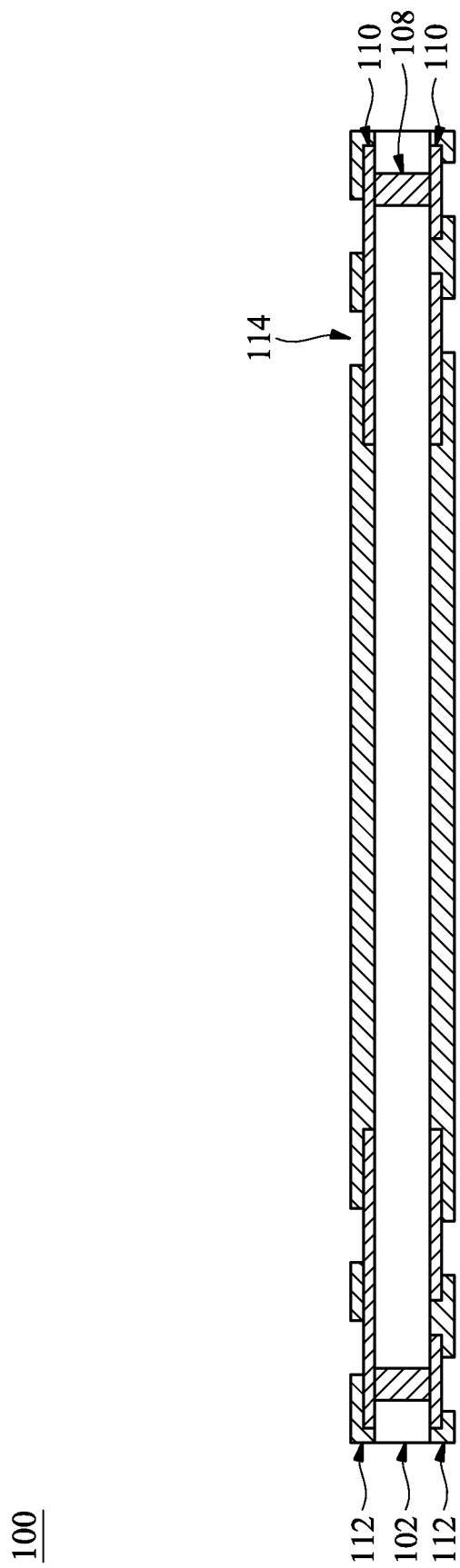

In FIG. 4, solder resist layers 112 are formed over the opposing sides of the substrate core 102, on the conductive lines 110. The solder resist layers 112 protect areas of the substrate core 102 from external damage. In some embodiments, the solder resist layers 112 are formed by depositing a photosensitive dielectric layer, exposing the photosensitive material with an optical pattern, and developing the exposed layer to form openings 114. In some embodiments, the solder resist layers 112 are formed by depositing a non-photosensitive dielectric layer (e.g., silicon oxide, or silicon nitride, or the like), and patterning the dielectric layer with acceptable photolithography and etching techniques to form the openings 114. The openings 114 expose underlying portions of the conductive lines 110 that may be used as connector pads in subsequent processes.

Figure 5:
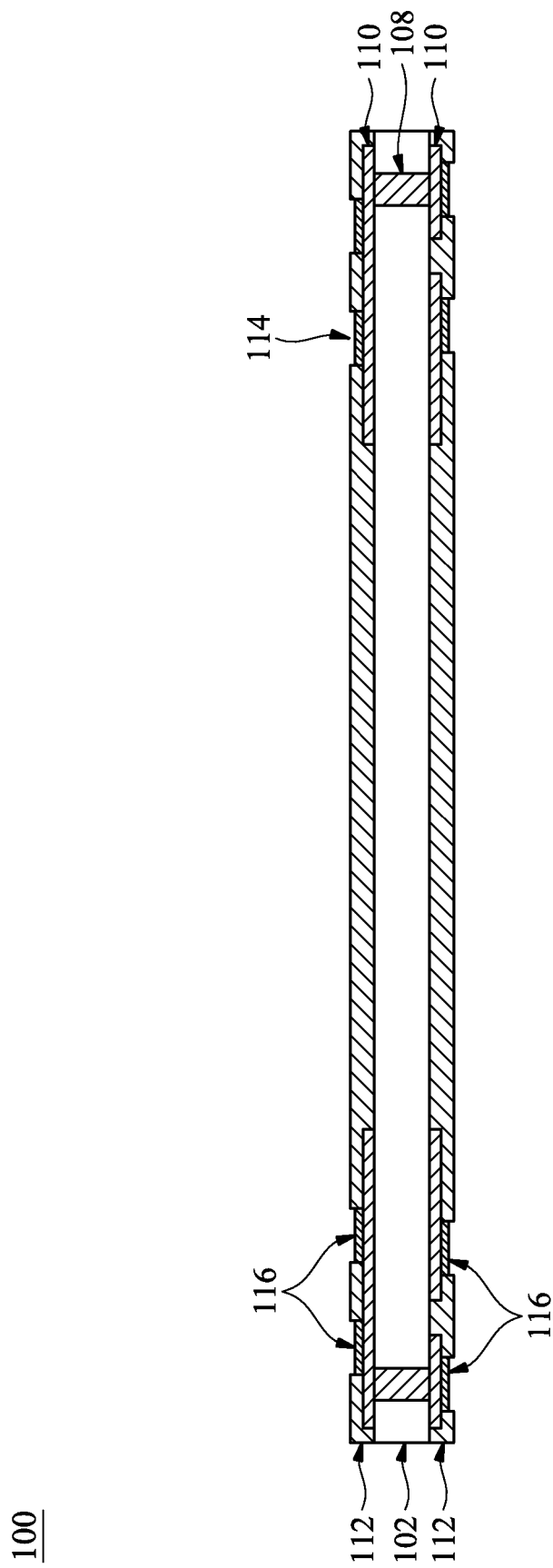

In FIG. 5, protection layers 116 are optionally formed in the openings 114, on exposed portions of the conductive lines 110. The protection layers 116 may each be a single layer or a composite layer including a plurality of layers. The protection layers 116 may be formed from a metal such as nickel, tin, tin-lead, gold, silver, palladium, indium, nickel-palladium-gold, nickel-gold, the like, or a combination thereof. In some embodiments, the protection layers 116 may be Electroless Nickel Immersion Gold (ENIG), which includes gold layers on the exposed portions of the conductive lines 110 and nickel layers on the gold layers. In some embodiments, the protection layers 116 may be Electroless Nickel Electroless Palladium Immersion Gold (ENEPIG), which includes gold layers on the exposed portions of the conductive lines 110, palladium layers on the gold layers, and nickel layers on the palladium layers. The protection layers 116 may be formed by electro plating, electroless plating, immersion, physical vapor deposition (PVD), or combinations thereof. The hardness of the protection layers 116 may be greater than the hardness of the underlying conductive lines 110.

Figure 6:
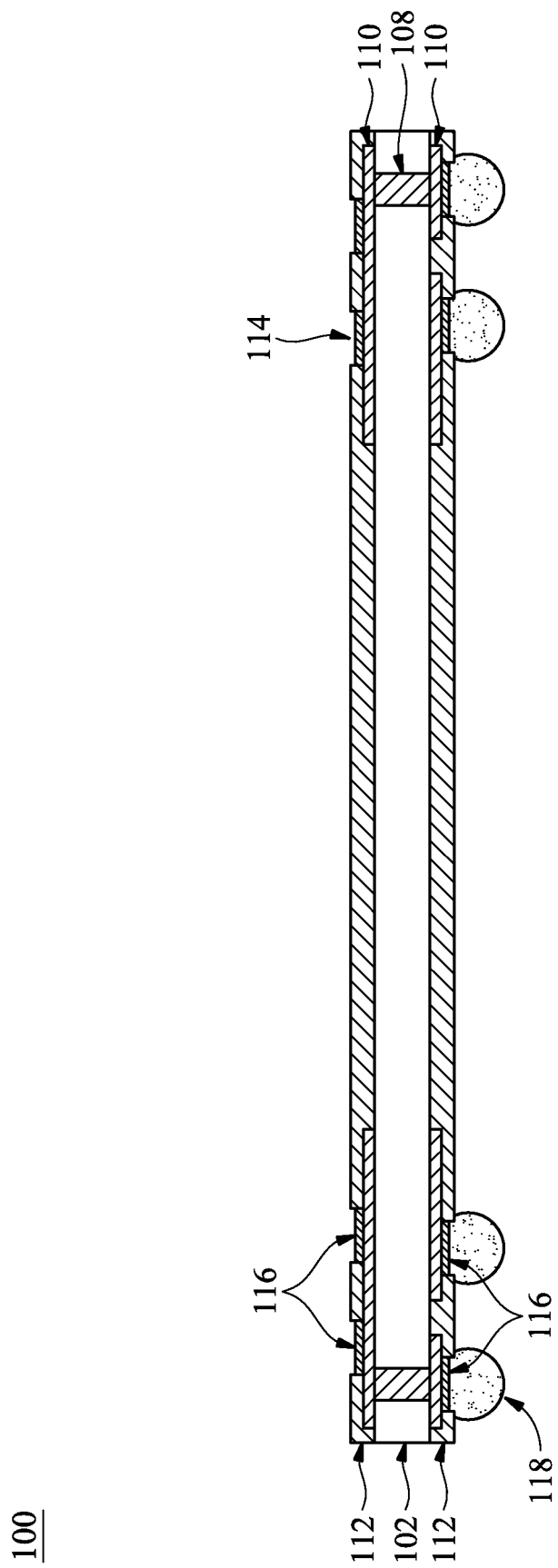

In FIG. 6, conductive connectors 118 are formed in the openings 114. In embodiments where the protection layers 116 are used, the conductive connectors 118 contact the protection layers 116. In embodiments where the protection layers 116 are omitted, the conductive connectors 118 contact the exposed portions of the conductive lines 110. The conductive connectors 118 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 118 may include a conductive material such as solder, copper, aluminum, gold, nickel, silver, palladium, tin, the like, or a combination thereof. In some embodiments, the conductive connectors 118 are solder connectors that are formed by initially forming a layer of solder through commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 118 comprise metal pillars (such as a copper pillar) formed by a sputtering, printing, electro plating, electroless plating, chemical vapor deposition (CVD), or the like. The metal pillars may be solder free and have substantially vertical sidewalls.

Figure 7A:
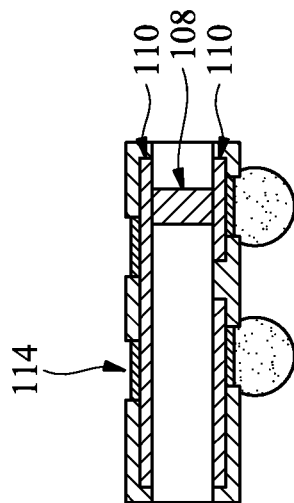
Figure 7A:
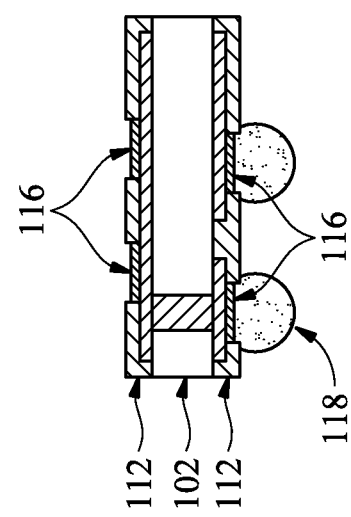

In FIG. 7A, a cavity 120 is formed by removing portions of the substrate core 102 and solder resist layers 112. Removal of material to form the cavity 120 may be accomplished by a mechanical drilling process with computer numeric control (CNC). In such embodiments, material is removed by a mechanical drill, with the position of the drill being controlled by a computer or controller. Removal may also be accomplished by other processes, such as a laser cutting process, a laser drilling process, or the like. Remaining portions of the material form the ring-shaped substrate 100.

Figure 7B:
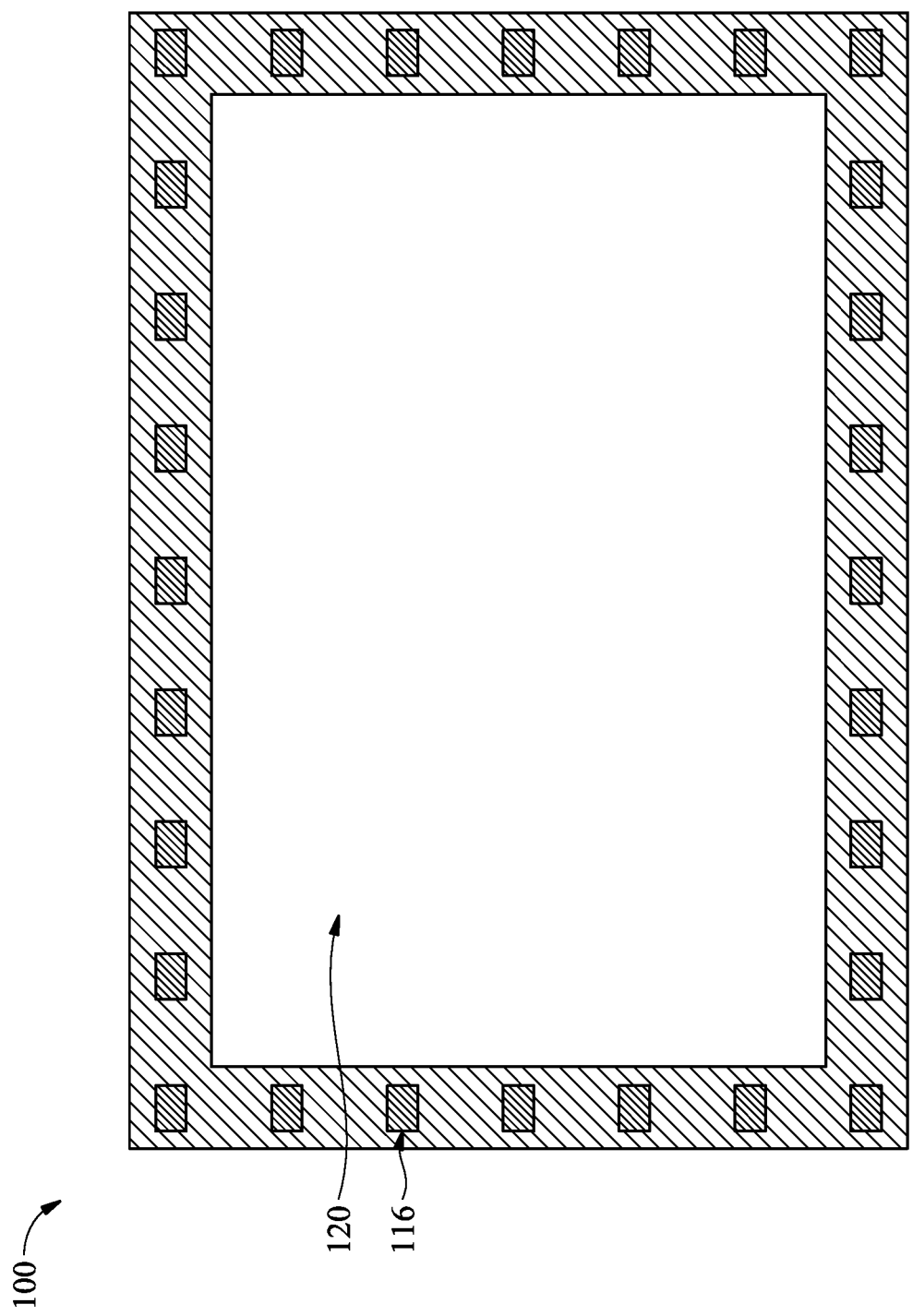

FIG. 7B is a top-down view of the ring-shaped substrate 100 of FIG. 7A.

As can be seen, the ring-shaped substrate 100 has a ring shape in the top-down view. The cavity 120 extends through a center portion of the ring-shaped substrate 100 to form the ring. The example ring-shaped substrate 100 in FIG. 7B is rectangular. It should be appreciated that other embodiments may have other shapes. For example, other ring-shaped substrates 100 may be circles, triangles, or the like.

FIGS. 8 through 17 are cross-sectional views of intermediate steps of a process for packaging the ring-shaped substrate 100 with other devices to form a package component 200, in accordance with some embodiments. The package component 200 includes multiple regions, and one ring-shaped substrate 100 is packaged in each region. One region of the package component 200 is illustrated.

Figure 8:
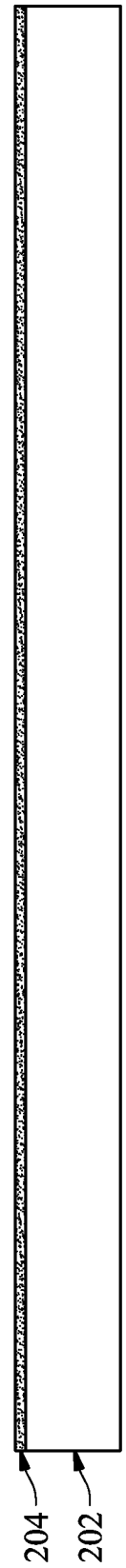
FIGS. 8 through 17 are cross-sectional views of intermediate steps of a process for packaging a ring-shaped substrate with other devices to form a package component, in accordance with some embodiments.

In FIG. 8, a carrier substrate 202 is provided, and a release layer 204 is formed on the carrier substrate 202. The carrier substrate 202 may be a glass carrier substrate, a ceramic carrier substrate, or the like. The carrier substrate 202 may be a wafer, such that multiple packages can be formed on the carrier substrate 202. The release layer 204 may be formed of a polymer-based material, which may be removed along with the carrier substrate 202 from the overlying structures that will be formed in subsequent steps. In some embodiments, the release layer 204 is an epoxy-based thermal-release material, which loses its adhesive property when heated, such as a light-to-heat-conversion (LTHC) release coating. In other embodiments, the release layer 204 may be an ultra-violet (UV) glue, which loses its adhesive property when exposed to UV lights. The release layer 204 may be dispensed as a liquid and cured, may be a laminate film laminated onto the carrier substrate 202, or may be the like. The top surface of the release layer 204 may be leveled and may have a high degree of coplanarity.

Figure 9:
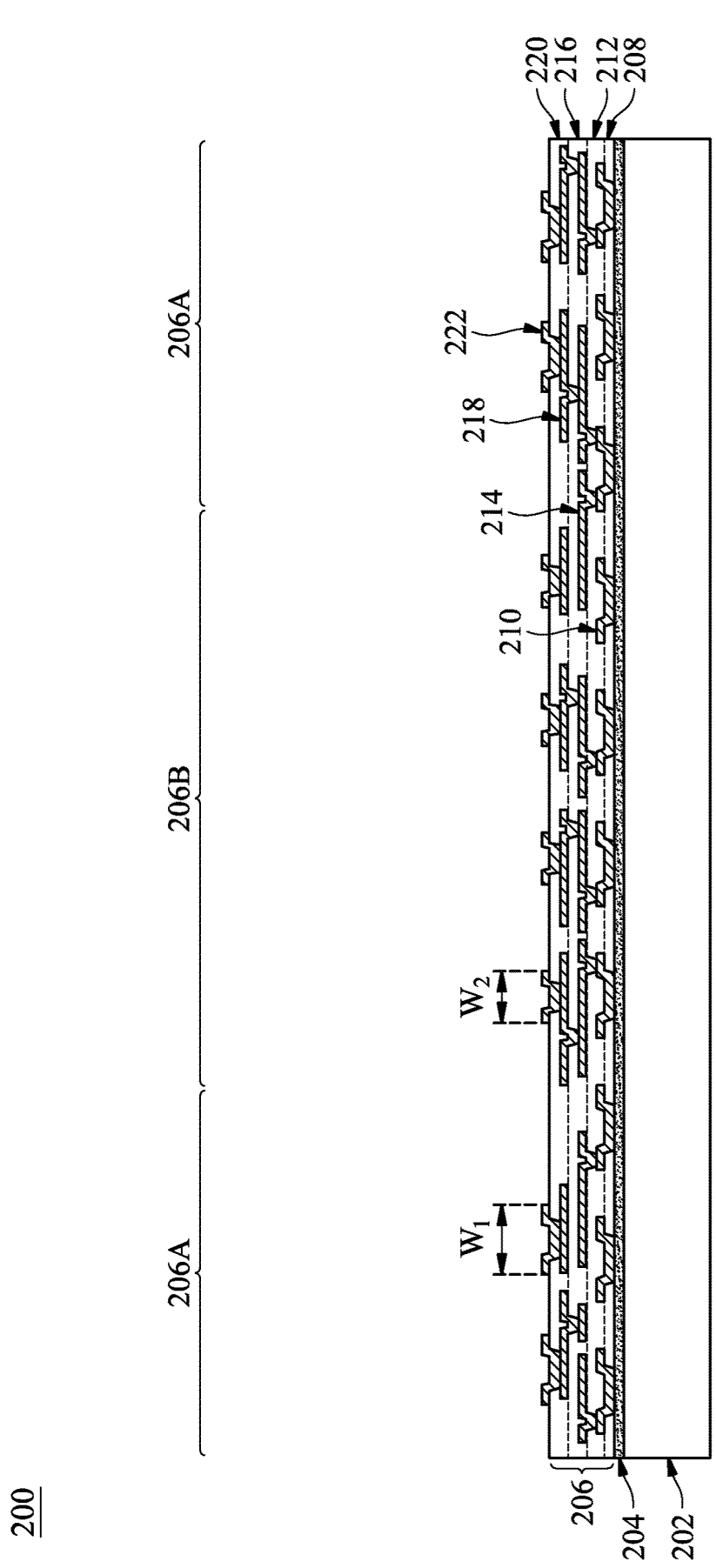

In FIG. 9, a first redistribution structure 206 is formed on the release layer 204. The first redistribution structure 206 includes dielectric layers 208, 212, 216, and 220; metallization patterns 210, 214, and 218; and under bump metallurgies (UBMs) 222. The metallization patterns 210, 214, and 218 may also be referred to as redistribution layers or redistribution lines. The first redistribution structure 206 is shown as an example. More or fewer dielectric layers and metallization patterns may be formed in the first redistribution structure 206. If fewer dielectric layers and metallization patterns are to be formed, steps and process discussed below may be omitted. If more dielectric layers and metallization patterns are to be formed, steps and processes discussed below may be repeated.

As an example to form the first redistribution structure 206, the dielectric layer 208 is deposited on the release layer 204. In some embodiments, the dielectric layer 208 is formed of a photo-sensitive material such as polybenzoxazole (PBO), polyimide, benzocyclobutene (BCB), or the like, which may be patterned using a lithography mask. The dielectric layer 208 may be formed by spin coating, lamination, CVD, the like, or a combination thereof. The dielectric layer 208 is then patterned. The patterning forms openings exposing portions of the release layer 204. The patterning may be by an acceptable process, such as by exposing the dielectric layer 208 to light when the dielectric layer 208 is a photo-sensitive material or by etching using, for example, an anisotropic etch. If the dielectric layer 208 is a photo-sensitive material, the dielectric layer 208 can be developed after the exposure.

The metallization pattern 210 is then formed. The metallization pattern 210 includes conductive lines on and extending along the major surface of the dielectric layer 208. The metallization pattern 210 further includes conductive vias extending through the dielectric layer 208. To form the metallization pattern 210, a seed layer is formed over the dielectric layer 208 and in the openings extending through the dielectric layer 208. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A photoresist is then formed and patterned on the seed layer. The photoresist may be formed by spin coating or the like and may be exposed to light for patterning. The pattern of the photoresist corresponds to the metallization pattern 210. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 210. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 212 is deposited on the metallization pattern 210 and dielectric layer 208. The dielectric layer 212 may be formed in a manner similar to the dielectric layer 208, and may be formed of the same material as the dielectric layer 208.

The metallization pattern 214 is then formed. The metallization pattern 214 includes conductive lines on and extending along the major surface of the dielectric layer 212. The metallization pattern 214 further includes conductive vias extending through the dielectric layer 212 to be physically and electrically connected to the metallization pattern 210. The metallization pattern 214 may be formed in a manner similar to the metallization pattern 210, and may be formed of the same material as the metallization pattern 210. The conductive vias of the metallization pattern 214 have smaller width than the conductive vias of the metallization pattern 210. As such, when patterning the dielectric layer 212 for the metallization pattern 214, the width of the openings in the dielectric layer 212 are smaller than the width of the openings in the dielectric layer 208.

The dielectric layer 216 is deposited on the metallization pattern 214 and dielectric layer 212. The dielectric layer 216 may be formed in a manner similar to the dielectric layer 208, and may be formed of the same material as the dielectric layer 208.

The metallization pattern 218 is then formed. The metallization pattern 218 includes conductive lines on and extending along the major surface of the dielectric layer 216. The metallization pattern 218 further includes conductive vias extending through the dielectric layer 216 to be physically and electrically connected to the metallization pattern 214. The metallization pattern 218 may be formed in a manner similar to the metallization pattern 210, and may be formed of the same material as the metallization pattern 210. The conductive vias of the metallization pattern 218 have smaller width than the conductive vias of the metallization pattern 210. As such, when patterning the dielectric layer 216 for the metallization pattern 218, the width of the openings in the dielectric layer 216 are smaller than the width of the openings in the dielectric layer 208.

The dielectric layer 220 is deposited on the metallization pattern 218 and dielectric layer 216. The dielectric layer 220 may be formed in a manner similar to the dielectric layer 208, and may be formed of the same material as the dielectric layer 208.

The UBMs 222 are formed on and extending through the dielectric layer 220. As an example to form the UBMs 222, the dielectric layer 220 may be patterned to form openings exposing portions of the metallization pattern 218. The patterning may be by an acceptable process, such as by exposing the dielectric layer 220 to light when the dielectric layer 220 is a photo-sensitive material or by etching using, for example, an anisotropic etch. If the dielectric layer 220 is a photo-sensitive material, the dielectric layer 220 can be developed after the exposure. The openings for the UBMs 222 may be wider than the openings for the conductive via portions of the metallization patterns 210, 214, and 218. A seed layer is formed over the dielectric layer 220 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 222. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBMs 222. In embodiments where the UBMs 222 are formed differently, more photoresist and patterning steps may be utilized.

The UBMs 222 may not all have the same width. In some embodiments, a first subset of the UBMs 222 in a first region 206A of the first redistribution structure 206 have a first width $W_1$, and a second subset of the UBMs 222 in a second region 206B of the first redistribution structure 206 have a second width $W_2$. The first width $W_1$ may be different from the second width $W_2$, and in some embodiments the first width $W_1$ is greater than the second width $W_2$.

Figure 10:
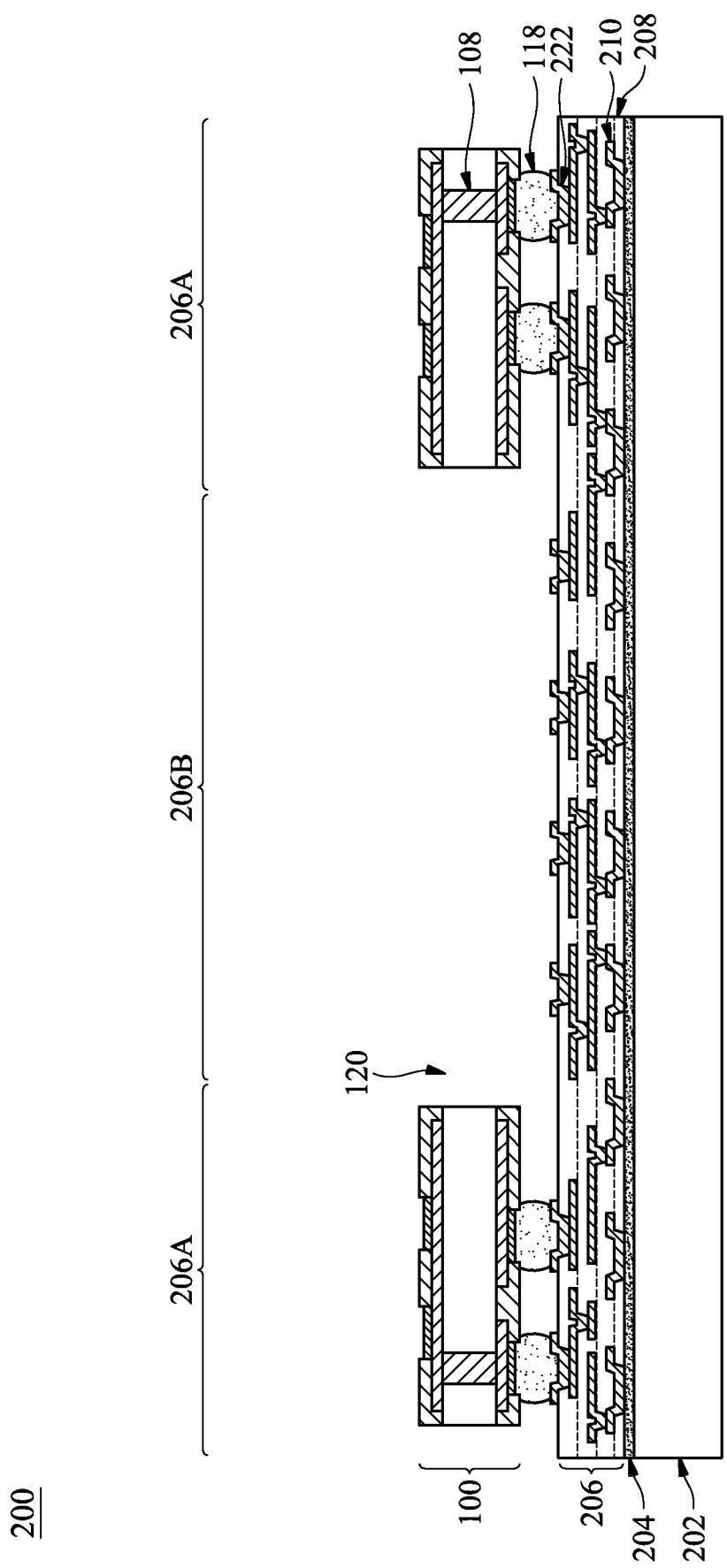

In FIG. 10, the ring-shaped substrate 100 is placed over the first redistribution structure 206. The ring-shaped substrate 100 may be aligned and placed using, e.g., a pick-and-place tool. The conductive connectors 118 of the ring-shaped substrate 100 are aligned with the UBMs 222 in the first region 206A, and the cavity 120 of the ring-shaped substrate 100 is aligned over the UBMs 222 in the second region 206B. In embodiments where the conductive connectors 118 are solder, the conductive connectors 118 may not be immediately reflowed to bond the ring-shaped substrate 100 to the UBMs 222. Reflow of the conductive connectors 118 may be delayed until a subsequent processing step. In embodiments where the conductive connectors 118 are copper pillars, solder may be formed, bonding the conductive connectors 118 to the first redistribution structure 206

Figure 11:
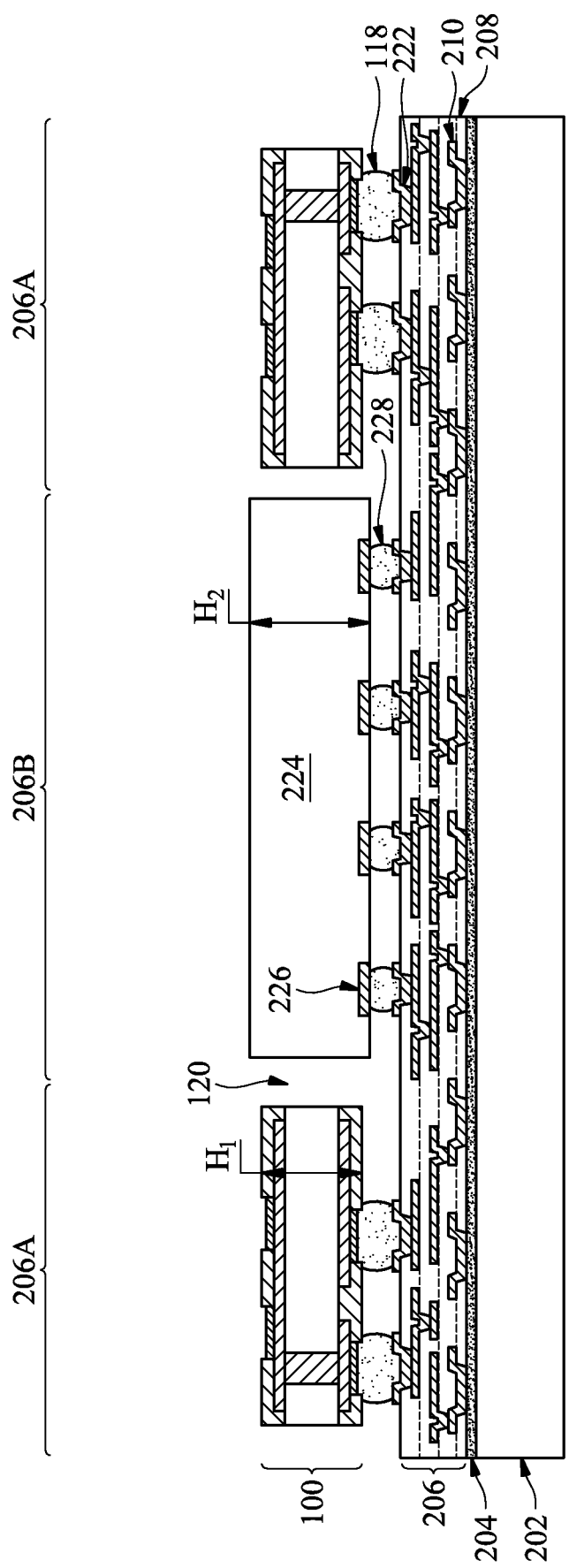

In FIG. 11, an integrated circuit die 224 is placed over the first redistribution structure 206. The integrated circuit die 224 may be a logic die (e.g., central processing unit, microcontroller, etc.), memory die (e.g., dynamic random access memory (DRAM) die, static random access memory (SRAM) die, etc.), power management die (e.g., power management integrated circuit (PMIC) die), radio frequency (RF) die, sensor die, micro-electro-mechanical-system (MEMS) die, signal processing die (e.g., digital signal processing (DSP) die), front-end die (e.g., analog front-end (AFE) die), the like, or a combination thereof (e.g., a system-on-chip (SoC)).

The integrated circuit die 224 includes a semiconductor substrate, with devices such as transistors, diodes, capacitors, resistors, etc., formed in and/or on the semiconductor substrate. The devices may be interconnected by interconnect structures formed by, for example, metallization patterns in one or more dielectric layers on the semiconductor substrate to form an integrated circuit. The integrated circuit die 224 further comprises pads 226, such as aluminum pads, to which external connections are made. The pads 226 are on what may be referred to as respective active sides of the integrated circuit die 224, and may be in uppermost layers of the interconnect structures. Because the active side of the integrated circuit die 224 faces toward the first redistribution structure 206, the first redistribution structure 206 may also be referred to as a "front-side redistribution structure." Conductive connectors 228 may be formed on the pads 226. The conductive connectors 228 may be formed from a conductive material such as solder, copper, aluminum, gold, nickel, silver, palladium, tin, the like, or a combination thereof. In some embodiments, the conductive connectors 228 are solder connectors.

The integrated circuit die 224 may be aligned and placed using, e.g., a pick-and-place tool. The integrated circuit die 224 is placed within the cavity 120 such that the conductive connectors 228 are aligned with the UBMs 222 in the second region 206B. After the integrated circuit die 224 is placed, the conductive connectors 228 are reflowed to form joints between corresponding UBMs 222 and pads 226, physically and electrically connecting the integrated circuit die 224 to the first redistribution structure 206. In embodiments where the conductive connectors 118 of the ring-shaped substrate 100 are solder and reflow is delayed, the conductive connectors 118 and 228 may be simultaneously reflowed in the same reflow process. As such, the conductive connectors 118 may also be reflowed to form joints between corresponding UBMs 222 and conductive lines 110, physically and electrically connecting the ring-shaped substrate 100 to the first redistribution structure 206. In other words, the integrated circuit die 224 and ring-shaped substrate 100 may be simultaneously bonded to the first redistribution structure 206. The conductive connectors 118 and 228 may be different size. In some embodiment, a height $H_1$ of the ring-shaped substrate 100 is less than or equal to a height $H_2$ of the integrated circuit die 224. The height $H_1$ may also be greater than the height $H_2$. Further, the width of the integrated circuit die 224 is less than the width of the cavity 120.

It should be appreciated that the integrated circuit die 224 and ring-shaped substrate 100 may be placed over the first redistribution structure 206 in any order. In some embodiments, the integrated circuit die 224 is placed first, and the ring-shaped substrate 100 is placed around the integrated circuit die 224.

Figure 12:
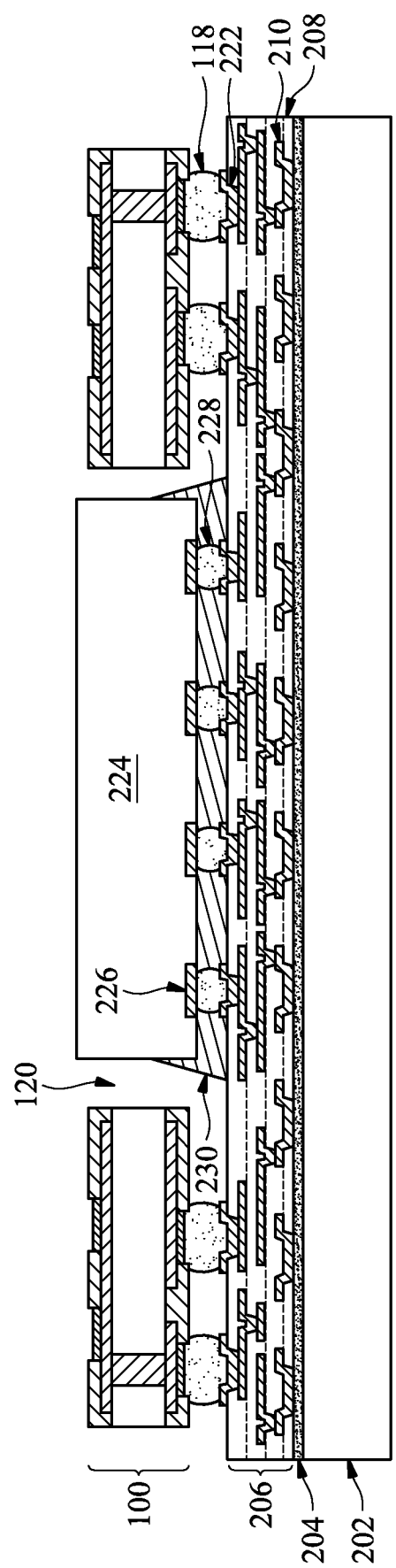

In FIG. 12, an underfill 230 may be formed between the integrated circuit die 224 and first redistribution structure 206, surrounding the conductive connectors 228. As such, the conductive connectors 228 may be protected from mechanical forces. The underfill 230 may be formed by a capillary flow process after the integrated circuit die 224 is attached, or may be formed by a suitable deposition method before the integrated circuit die 224 is attached.

Figure 13:
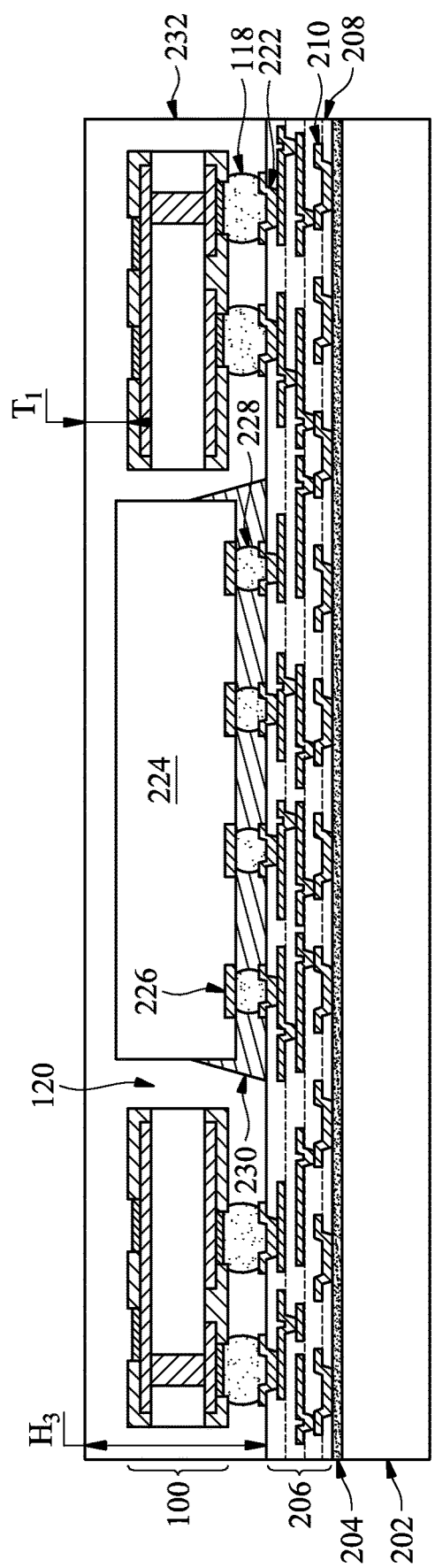

In FIG. 13, an encapsulant 232 is formed on the various components. The encapsulant 232 may be a molding compound, epoxy, or the like, and may be applied by compression molding, transfer molding, or the like. The encapsulant 232 may be formed over the first redistribution structure 206 such that the integrated circuit die 224 and ring-shaped substrate 100 are buried or covered and the cavity 120 is filled. Portions of the encapsulant 232 burying the ring-shaped substrate 100 have a thickness $T_1$. In some embodiments, the thickness $T_1$ is in the range of from about 10 µm to about 100 µm. The encapsulant 232 is then cured, and may optionally be planarized by, e.g., a grinding or chemical-mechanical polish (CMP) process. After formation, the encapsulant 232 has a height $H_3$, which is greater than the heights $H_1$ and $H_2$. The encapsulant 232 is also formed between the first redistribution structure 206 and the integrated circuit die 224, for example, in embodiments where the underfill 230 is omitted.

The ring-shaped substrate 100 occupies a significant portion of the vertical height of the package component 200, and so the amount of encapsulant 232 needed to cover the integrated circuit die 224 may be reduced. For example, a ratio of the height $H_3$ to the height $H_1$ may be from about 1:0.14 to about 1:0.60. The overall height of the package component 200 may thus be increased without significantly increasing the amount of encapsulant 232 used. Reducing the amount of encapsulant 232 used may help avoid package warpage caused by CTE mismatch between the encapsulant 232 and other components of the package component 200.

Figure 14:
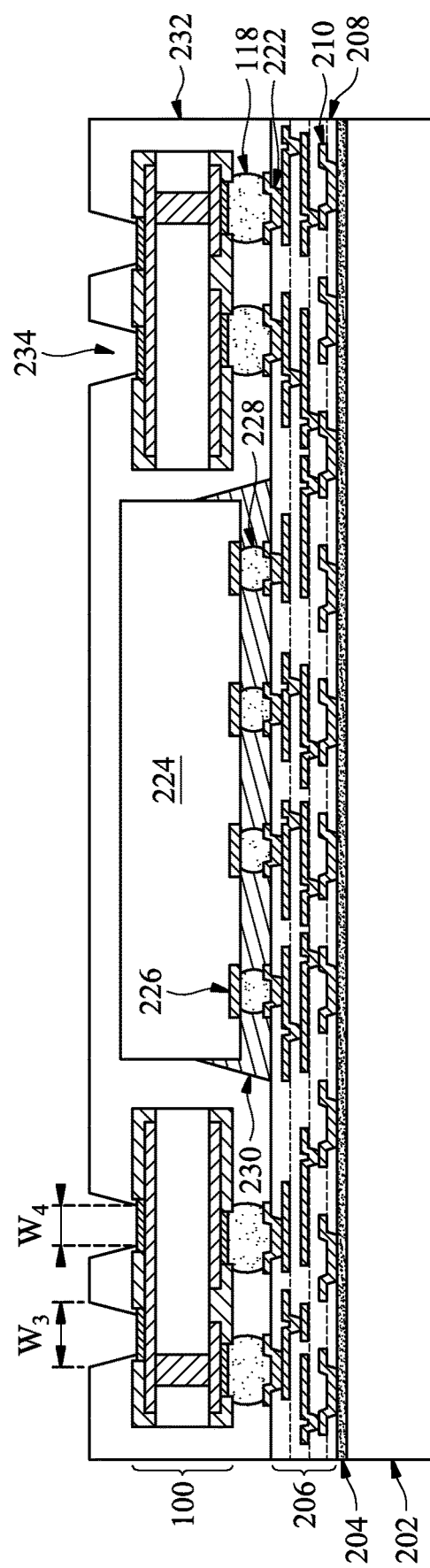

In FIG. 14, openings 234 are formed in the encapsulant 232 exposing the protection layers 116 of the ring-shaped substrate 100. The openings 234 may be formed by a drilling process such as laser drilling, mechanical drilling, or the like. The openings 234 may have a tapered profile, with an upper width $W_3$, and a lower width $W_4$ that is less than or equal to the upper width $W_3$. In some embodiments, the upper width $W_3$ is in the range of from about 50 µm to about 350 µm, and the lower width $W_4$ is in the range of from about 50 µm to about 200 µm.

Figure 15:
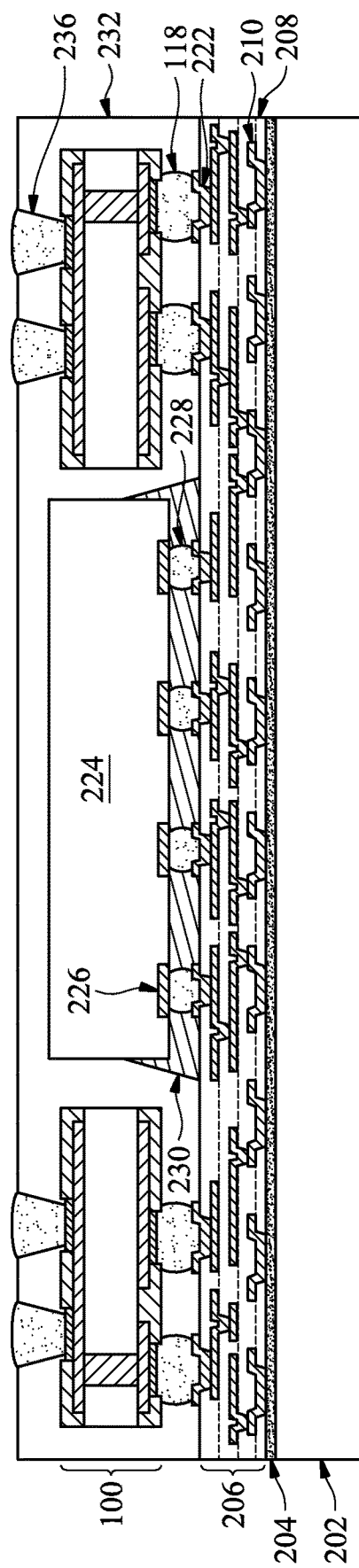

In FIG. 15, conductive connectors 236 are formed in the openings 234. The conductive connectors 236 may be formed from a metal such as solder, copper, aluminum, gold, nickel, silver, palladium, tin, the like, or a combination thereof. In some embodiments, the conductive connectors 236 are formed from a paste such as copper paste, solder paste, silver paste, or the like, and are dispensed by a printing process or the like. In embodiments where a printing process is used, an image with the desired pattern of the conductive connectors 236 is printed on the encapsulant 232 and in the openings 234 using a stencil. After formation, the conductive paste is cured to harden it, thereby forming the conductive connectors 236. The conductive paste may be cured by an annealing process performed at a temperature of about 80° C. to about 230° C., and for a time of from about 20 minutes to about 4 hours. In embodiments where the conductive connectors 236 are a paste, the conductive connectors 236 may overfill the openings such that they have via portions extending through the encapsulant 232, and upper portions extending along the top surface of the encapsulant 232.

Figure 16:
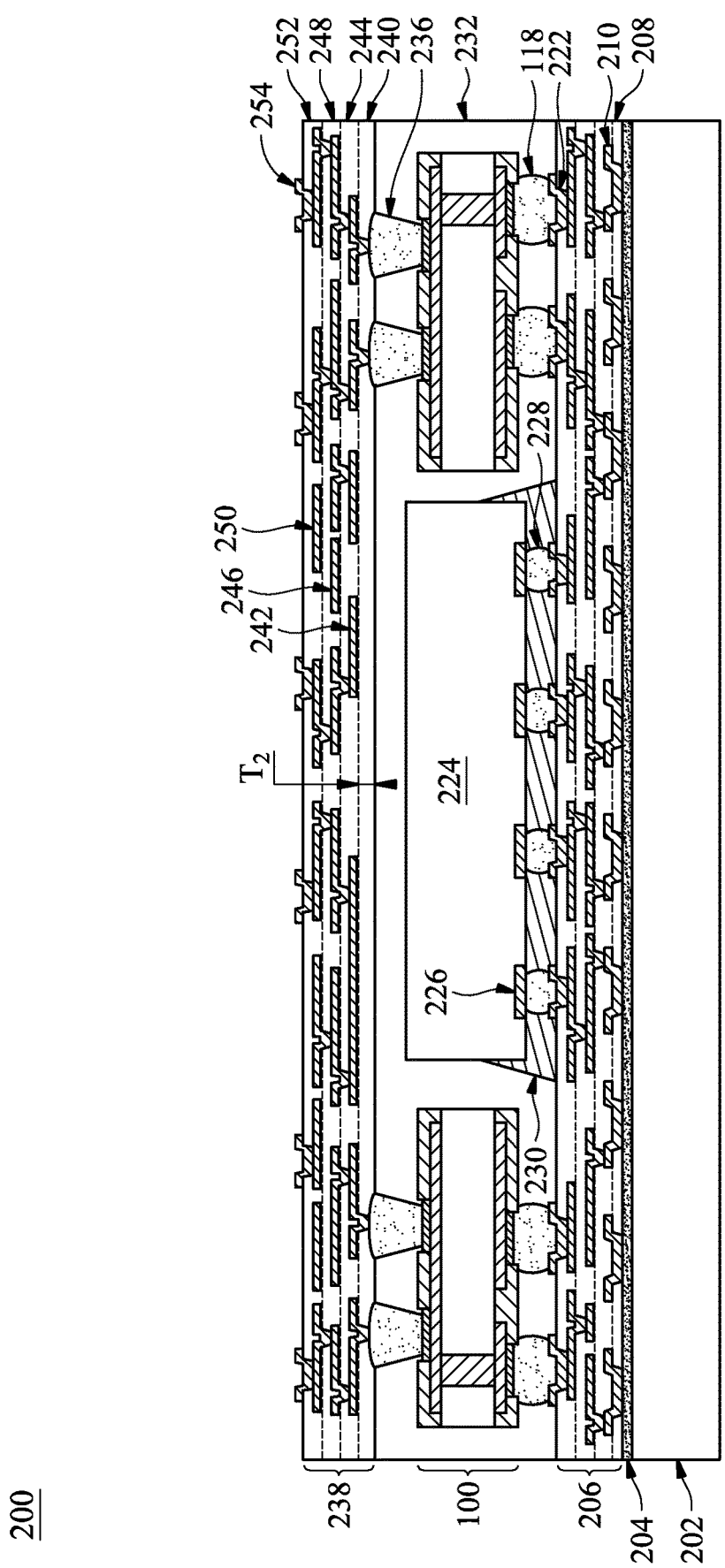

In FIG. 16, a second redistribution structure 238 is formed over the conductive connectors 236 and encapsulant 232. Because the active side of the integrated circuit die 224 faces away from the second redistribution structure 238, the second redistribution structure 238 may also be referred to as a "back-side redistribution structure." The second redistribution structure 238 includes dielectric layers 240, 244, 248, and 252; metallization patterns 242, 246, and 250; and UBMs 254. The metallization patterns may also be referred to as redistribution layers or redistribution lines. The second redistribution structure 238 is shown as an example. More or fewer dielectric layers and metallization patterns may be formed in the second redistribution structure 238. If fewer dielectric layers and metallization patterns are to be formed, steps and process discussed below may be omitted. If more dielectric layers and metallization patterns are to be formed, steps and processes discussed below may be repeated.

As an example to form the second redistribution structure 238, the dielectric layer 240 is deposited on the conductive connectors 236 and encapsulant 232. In some embodiments, the dielectric layer 240 is formed of a photo-sensitive material such as PBO, polyimide, BCB, or the like, which may be patterned using a lithography mask. The dielectric layer 240 may be formed by spin coating, lamination, CVD, the like, or a combination thereof. The dielectric layer 240 is then patterned. The patterning forms openings exposing portions of the conductive connectors 236. The patterning may be by an acceptable process, such as by exposing the dielectric layer 240 to light when the dielectric layer 240 is a photo-sensitive material or by etching using, for example, an anisotropic etch. If the dielectric layer 240 is a photo-sensitive material, the dielectric layer 240 can be developed after the exposure.

In embodiments where the conductive connectors 236 overfill the openings, the dielectric layer 240 may be used as a planarization reset layer. Notably, the dielectric layer 240 may be formed to a greater thickness than typical for the bottom dielectric layer of a redistribution structure to allow for planarization. After formation, the dielectric layer 240 may have a thickness $T_2$ in the range of from about 5 µm to about 15 µm. In some embodiments, a post-formation planarization process is performed. The planarization process may include performing a grinding process or a CMP process on the dielectric 240. By using the dielectric layer 240 as a planarization reset layer, the top surface of the dielectric layer 240 may be substantially planar, and may have a higher degree of planarity than the bottom surface(s) of the dielectric layer 240. After planarization, the thickness of the dielectric layer 240 may be decreased. The thickness of the dielectric layer 240 (e.g., the bottom dielectric layer) is thicker than other dielectric layers of the second redistribution structure 238, such as the dielectric layer 252 (e.g., the top dielectric layer).

The metallization pattern 242 is then formed. The metallization pattern 242 includes conductive lines on and extending along the major surface of the dielectric layer 240. The metallization pattern 242 further includes conductive vias extending through the dielectric layer 240 to be physically and electrically connected to the conductive connectors 236. To form the metallization pattern 242, a seed layer is formed over the dielectric layer 240 and in the openings extending through the dielectric layer 240. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 242. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 242. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 244 is deposited on the metallization pattern 242 and dielectric layer 240. The dielectric layer 244 may be formed in a manner similar to the dielectric layer 240, and may be formed of the same material as the dielectric layer 240.

The metallization pattern 246 is then formed. The metallization pattern 246 includes conductive lines on and extending along the major surface of the dielectric layer 244. The metallization pattern 246 further includes conductive vias extending through the dielectric layer 244 to be physically and electrically connected to the metallization pattern 242. The metallization pattern 246 may be formed in a manner similar to the metallization pattern 242, and may be formed of the same material as the metallization pattern 242.

The dielectric layer 248 is deposited on the metallization pattern 246 and dielectric layer 244. The dielectric layer 248 may be formed in a manner similar to the dielectric layer 240, and may be formed of the same material as the dielectric layer 240.

The metallization pattern 250 is then formed. The metallization pattern 250 includes conductive lines on and extending along the major surface of the dielectric layer 248. The metallization pattern 250 further includes conductive vias extending through the dielectric layer 248 to be physically and electrically connected to the metallization pattern 246. The metallization pattern 250 may be formed in a manner similar to the metallization pattern 242, and may be formed of the same material as the metallization pattern 242.

The dielectric layer 252 is deposited on the metallization pattern 250 and dielectric layer 248. The dielectric layer 252 may be formed in a manner similar to the dielectric layer 240, and may be formed of the same material as the dielectric layer 240.

The UBMs 254 are formed on and extending through the dielectric layer 252. As an example to form the UBMs 254, the dielectric layer 252 may be patterned to form openings exposing portions of the metallization pattern 250. The patterning may be by an acceptable process, such as by exposing the dielectric layer 252 to light when the dielectric layer 252 is a photo-sensitive material or by etching using, for example, an anisotropic etch. If the dielectric layer 252 is a photo-sensitive material, the dielectric layer 252 can be developed after the exposure. The openings for the UBMs 254 may be wider than the openings for the conductive via portions of the metallization patterns 242, 246, and 250. A seed layer is formed over the dielectric layer 252 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 254. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBMs 254. In embodiments where the UBMs 254 are formed differently, more photoresist and patterning steps may be utilized.

After formation, the ring-shaped substrate 100 electrically connects the various features of the package component 200. In particular, the ring-shaped substrate 100, conductive connectors 118, and conductive connectors 236 electrically and physically connect the first redistribution structure 206 to the second redistribution structure 238. The integrated circuit die 224 is thus electrically connected to the second redistribution structure 238 through the first redistribution structure 206 and the ring-shaped substrate 100.

Figure 17:
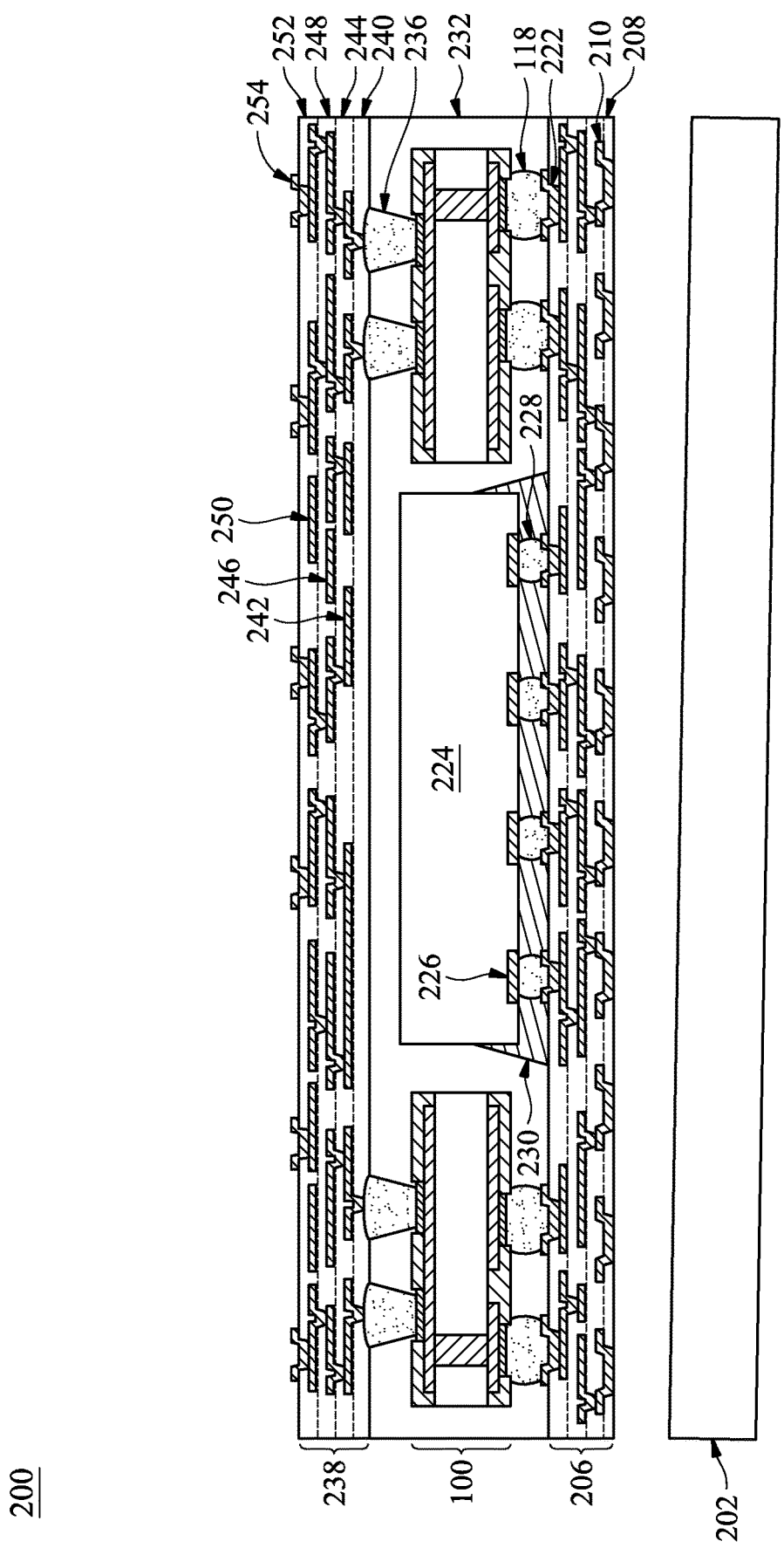

In FIG. 17, a carrier substrate de-bonding is performed to detach (or "de-bond") the carrier substrate 202 from the first redistribution structure 206, e.g., the dielectric layer 208. In some embodiments, the de-bonding includes projecting a light such as a laser light or an UV light on the release layer 204 so that the release layer 204 decomposes under the heat of the light and the carrier substrate 202 can be removed. The structure is then flipped over and placed on a tape. The de-bonding exposes the metallization patterns 210 of the first redistribution structure 206.

Figure 18:
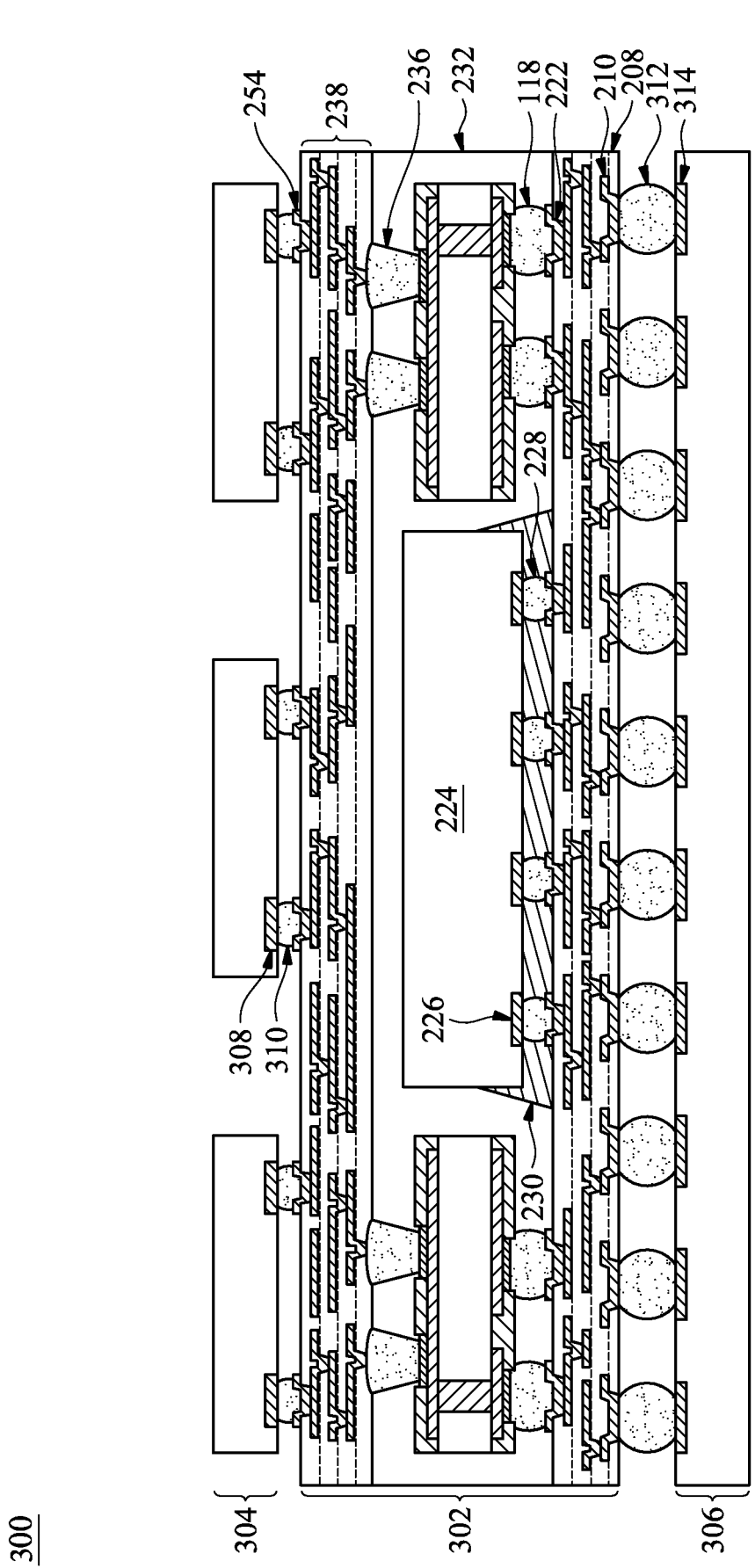
FIG. 18 is a cross-sectional view of a package structure, in accordance with some embodiments.

FIG. 18 is a cross-sectional view of a package structure 300, in accordance with some embodiments. The package structure 300 includes a first package 302, integrated circuit dies 304, and a package substrate 306. The package structure 300 may be referred to as a side-by-side multi-chip-module (SBS-MCM).

The first package 302 is one of the packages formed in the package component 200. A singulation process is performed on the package component 200 by sawing along scribe line regions, e.g., between the adjacent package regions of the package component 200. The resulting singulated first packages 302 are from one of the singulated package regions.

The integrated circuit dies 304 may be dies that communicate with the integrated circuit die 224 to form a complete system. For example, in embodiments where the integrated circuit die 224 is a logic die, the integrated circuit dies 304 may be memory dies, RF dies, passive devices, or combinations thereof. The integrated circuit dies 304 include a semiconductor substrate, with devices such as transistors, diodes, capacitors, resistors, etc., formed in and/or on the semiconductor substrate. The devices may be interconnected by interconnect structures formed by, for example, metallization patterns in one or more dielectric layers on the semiconductor substrate to form an integrated circuit. The integrated circuit dies 304 further comprises pads 308, such as aluminum pads, to which external connections are made. The pads 308 are on what may be referred to as respective active sides of the integrated circuit dies 304, and may be in uppermost layers of the interconnect structures. Conductive connectors 310 may be formed on the pads 308. The conductive connectors 310 may be formed from a conductive material such as solder, copper, aluminum, gold, nickel, silver, palladium, tin, the like, or a combination thereof. The integrated circuit dies 304 are mounted to the UBMs 254 using the conductive connectors 310. In some embodiments, the conductive connectors 310 are reflowed to attach the integrated circuit dies 304 to the UBMs 254. In some embodiments, an underfill or encapsulant is formed to fill the gap between the integrated circuit dies 304 and the second redistribution structure 238. Because the amount of encapsulant 232 used is reduced, the thickness of the first package 302 may be reduced, which may allow integrated circuit dies 304 of greater thickness to be attached. For example, when the integrated circuit dies 304 are memory devices, the capacity of the memory devices may be increased.

The first package 302 is then mounted to a package substrate 306 using conductive connectors 312. The package substrate 306 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 306 may be a silicon-on-insulator (SOI) substrate. Generally, an SOI substrate includes a layer of a semiconductor material such as epitaxial silicon, germanium, silicon germanium, SOI, silicon-germanium-on-insulator (SGOI), or combinations thereof. The package substrate 306 is, in one alternative embodiment, based on an insulating core such as a fiberglass reinforced resin core. One example core material is fiberglass resin such as FR4. Alternatives for the core material include bismaleimide-triazine (BT) resin, or alternatively, other PCB materials or films. Build-up films such as Ajinomoto Build-up film (ABF) or other laminates may be used for package substrate 306.

The package substrate 306 may include active and passive devices (not shown). As one of ordinary skill in the art will recognize, a wide variety of devices such as transistors, capacitors, resistors, combinations of these, and the like may be used to generate the structural and functional requirements of the design for the package structure 300. The devices may be formed using any suitable methods.

The package substrate 306 may also include metallization layers and vias (not shown) and bond pads 314 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 306 is substantially free of active and passive devices.

The conductive connectors 312 may be formed from a conductive material such as solder, copper, aluminum, gold, nickel, silver, palladium, tin, the like, or a combination thereof. In some embodiments, the conductive connectors 312 are reflowed to attach the first package 302 to the bond pads 314. The conductive connectors 312 electrically and/or physically couple the package substrate 306, including metallization layers in the package substrate 306, to the metallization patterns 210 of the first package 302. In some embodiments, passive devices (e.g., surface mount devices (SMDs), not illustrated) may be attached to the first package 302 (e.g., bonded to the bond pads 314) prior to mounting on the package substrate 306. In such embodiments, the passive devices may be bonded to a same surface of the first package 302 as the conductive connectors 312.

The conductive connectors 312 may have an epoxy flux (not shown) formed thereon before they are reflowed with at least some of the epoxy portion of the epoxy flux remaining after the first package 302 is attached to the package substrate 306. This remaining epoxy portion may act as an underfill to reduce stress and protect the joints resulting from the reflowing the conductive connectors 312. In some embodiments, an underfill (not shown) may be formed between the first package 302 and the package substrate 306 and surrounding the conductive connectors 312. The underfill may be formed by a capillary flow process after the first package 302 is attached or may be formed by a suitable deposition method before the first package 302 is attached.

Figure 19:
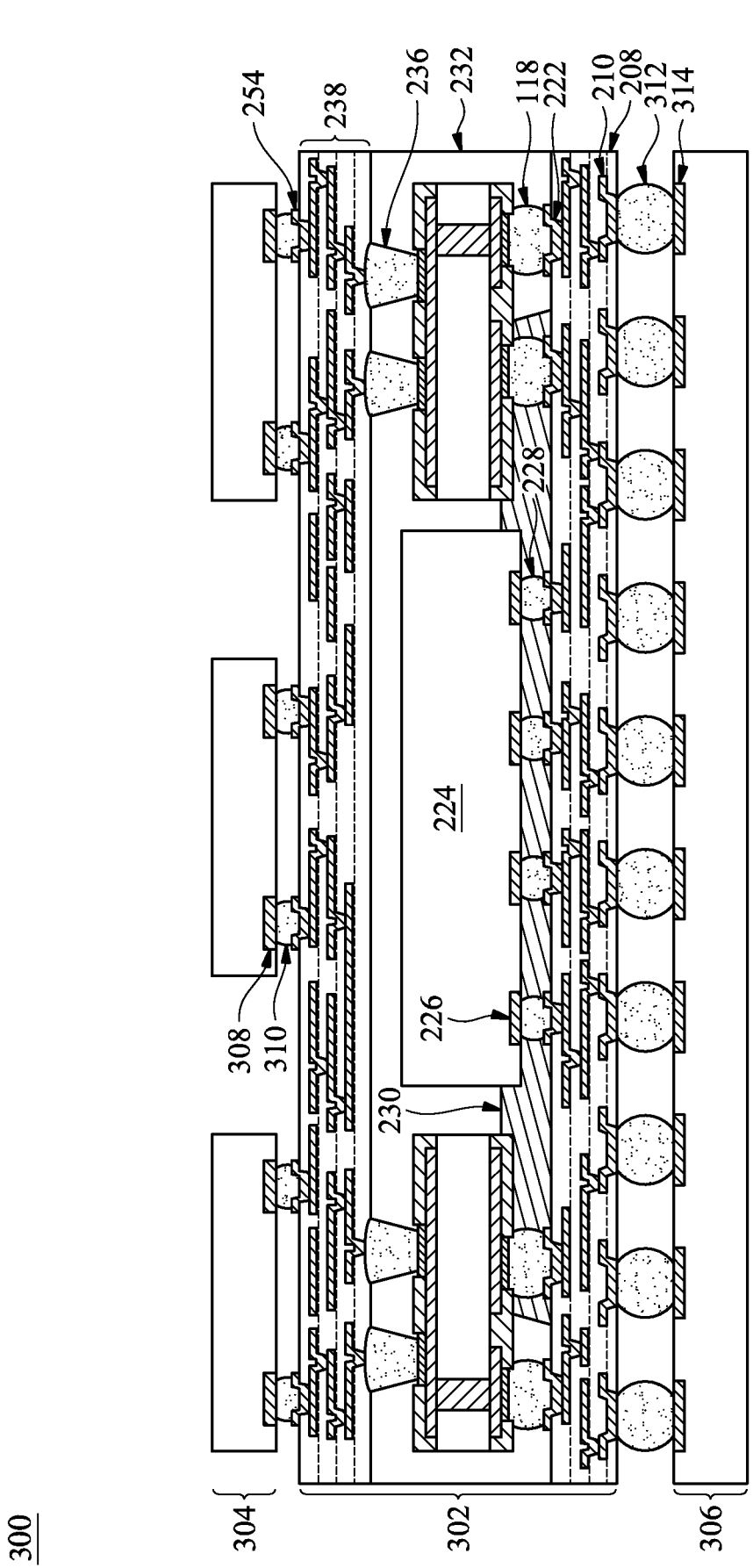
FIG. 19 is a cross-sectional view of a package structure, in accordance with some other embodiments.

FIG. 19 is a cross-sectional view of the package structure 300, in accordance with some other embodiments. In the embodiment shown, the underfill 230 is also formed to surround a subset of the conductive connectors 118. As such, some of the conductive connectors 118 may be protected from mechanical forces.

Figure 20:
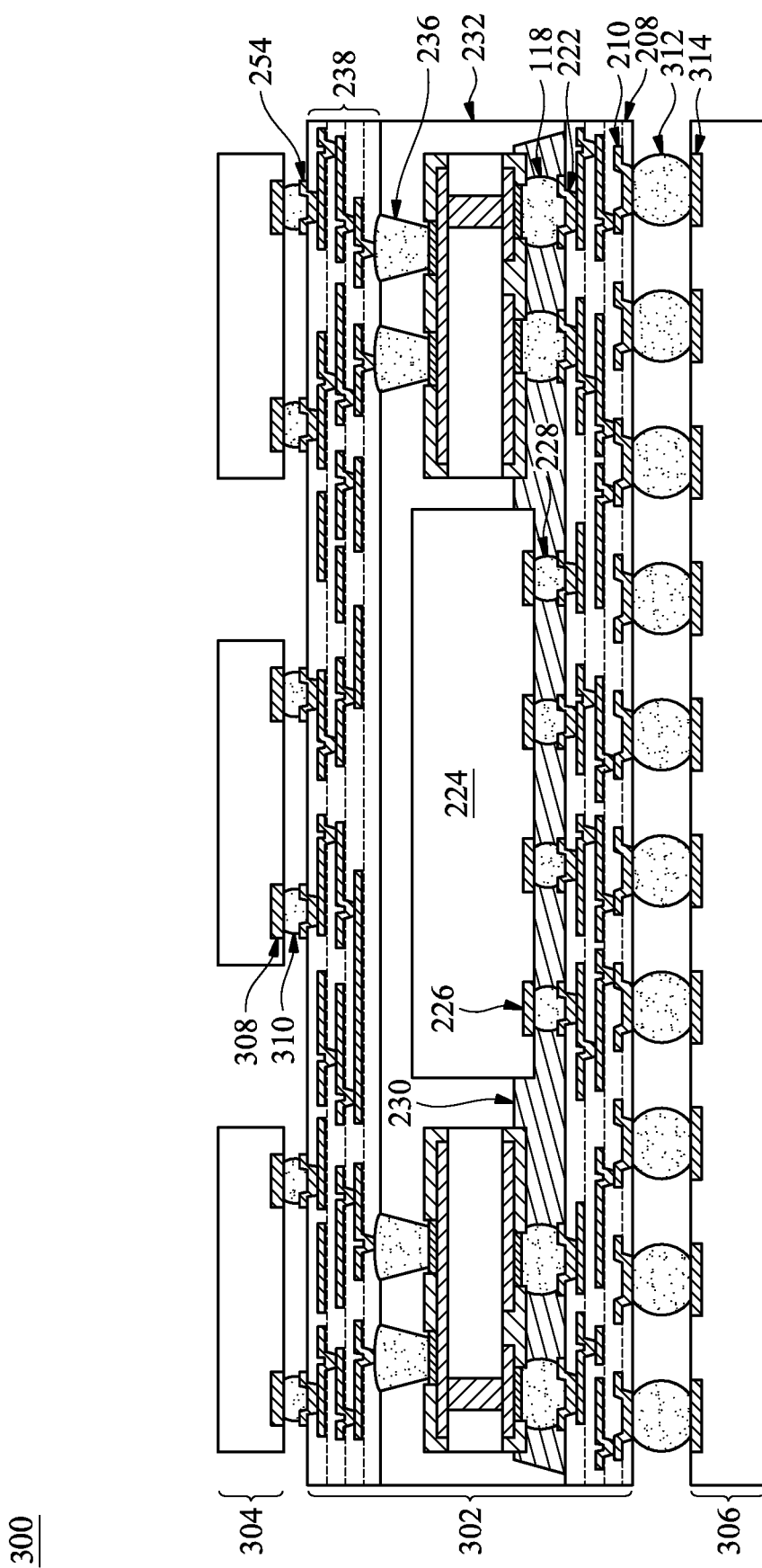
FIG. 20 is a cross-sectional view of a package structure, in accordance with some other embodiments.

FIG. 20 is a cross-sectional view of the package structure 300, in accordance with some other embodiments. In the embodiment shown, the underfill 230 is also formed to surround all of the conductive connectors 118. As such, all of the conductive connectors 118 may be protected from mechanical forces.

Embodiments may achieve advantages. The ring-shaped substrate 100 is rigid. Using the ring-shaped substrate 100 containing conductive vias 108 may increase the vertical support of the package component 200, as compared to directly forming conductive vias on the first redistribution structure 206. Further, by soldering the ring-shaped substrate 100 to the first redistribution structure 206, delamination of conductive vias from the first redistribution structure 206 may be avoided.

In an embodiment, a package includes: a first redistribution structure; a first integrated circuit die connected to the first redistribution structure; a ring-shaped substrate surrounding the first integrated circuit die, the ring-shaped substrate connected to the first redistribution structure, the ring-shaped substrate including a core and conductive vias extending through the core; a encapsulant surrounding the ring-shaped substrate and the first integrated circuit die, the encapsulant extending through the ring-shaped substrate; and a second redistribution structure on the encapsulant, the second redistribution structure connected to the first redistribution structure through the conductive vias of the ring-shaped substrate.

In some embodiments, the package further includes: first conductive connectors extending through a first portion of the encapsulant, the first conductive connectors connecting the first integrated circuit die to the first redistribution structure; and second conductive connectors extending through a second portion of the encapsulant, the second conductive connectors connecting the ring-shaped substrate to the first redistribution structure, the second conductive connectors being a different size than the first conductive connectors. In some embodiments, the package further includes: an underfill disposed between the first integrated circuit die and the first redistribution structure, the underfill surrounding the first conductive connectors. In some embodiments of the package, the underfill further surrounds a first subset of the second conductive connectors without surrounding a second subset of the second conductive connectors. In some embodiments of the package, the underfill further surrounds all of the second conductive connectors. In some embodiments of the package, the first conductive connectors and the second conductive connectors include copper pillars. In some embodiments of the package, the first conductive connectors and the second conductive connectors include solder connectors. In some embodiments, the package further includes: third conductive connectors extending through a third portion of the encapsulant, the third conductive connectors connecting the ring-shaped substrate to the second redistribution structure. In some embodiments of the package, the third conductive connectors include conductive paste. In some embodiments of the package, the second redistribution structure includes a bottom dielectric layer and a top dielectric layer, the bottom dielectric layer contacting the third conductive connectors and the encapsulant, a top surface of the bottom dielectric layer having a higher degree of planarity than a bottom surface of the bottom dielectric layer, the bottom dielectric layer being thicker than the top dielectric layer. In some embodiments of the package, the ring-shaped substrate further includes: first conductive lines on a first side of the ring-shaped substrate, the first conductive lines connecting the conductive vias to the first redistribution structure; a first solder resist on the first conductive lines, the first solder resist surrounding the first conductive connectors; second conductive lines on a second side of the ring-shaped substrate, the second conductive lines connecting the conductive vias to the second redistribution structure; and a second solder resist on the second conductive lines, the second solder resist surrounding the third conductive connectors. In some embodiments of the package, a first height of the first integrated circuit die is greater than or equal to a second height of the ring-shaped substrate. In some embodiments, the package further includes: a second integrated circuit die connected to the second redistribution structure; and a package substrate connected to the first redistribution structure. In some embodiments of the package, the core includes a pre-impregnated composite fiber.

In an embodiment, a method includes: patterning first openings in a substrate; forming conductive vias in the first openings; forming first conductive connectors connected to the conductive vias, the first conductive connectors being on a first side of the substrate; patterning a cavity in the substrate; placing the substrate on a first redistribution structure, the first conductive connectors being coupled to the first redistribution structure; placing an integrated circuit die on the first redistribution structure and in the cavity of the substrate, the integrated circuit die including second conductive connectors coupled to the first redistribution structure; encapsulating the integrated circuit die and the substrate with an encapsulant; and forming a second redistribution structure on the encapsulant, the second redistribution structure connected to the first redistribution structure through the conductive vias of the substrate.

In some embodiments, the method further includes: reflowing the first conductive connectors and the second conductive connectors to simultaneously bond the substrate and the integrated circuit die to the first redistribution structure. In some embodiments, the method further includes: forming second openings in the encapsulant; and dispensing conductive paste in the second openings. In some embodiments of the method, forming the second redistribution structure includes: forming a bottom dielectric layer on the conductive paste and the encapsulant; planarizing the bottom dielectric layer; and forming a metallization pattern extending along and through the bottom dielectric layer.

In an embodiment, a method includes: connecting a ring-shaped substrate to a first redistribution structure, the ring-shaped substrate including: a core having a cavity; first conductive vias extending through the core; and conductive lines on the core, the conductive lines connected to the first conductive vias; connecting a first integrated circuit die to the first redistribution structure, the first integrated circuit die disposed in the cavity of the ring-shaped substrate; encapsulating the ring-shaped substrate and the first integrated circuit die with an encapsulant; and forming a second redistribution structure on the encapsulant, the second redistribution structure connected to the first redistribution structure through the first conductive vias and the conductive lines of the ring-shaped substrate.

In some embodiments, the method further includes: patterning openings in the encapsulant exposing the conductive lines of the ring-shaped substrate; and filling the openings with a conductive paste to form second conductive vias, the second redistribution structure connected to the second conductive vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   patterning first openings in a substrate;
   forming conductive vias in the first openings;
   forming first conductive connectors connected to the conductive vias, the first conductive connectors being on a first side of the substrate;
   patterning a cavity in the substrate;
   placing the substrate on a first redistribution structure, the first conductive connectors being coupled to the first redistribution structure;
   placing an integrated circuit die on the first redistribution structure and in the cavity of the substrate, the integrated circuit die comprising second conductive connectors coupled to the first redistribution structure;
   reflowing the first conductive connectors and the second conductive connectors to bond the substrate and the integrated circuit die to the first redistribution structure;
   encapsulating the integrated circuit die and the substrate with an encapsulant; and
   forming a second redistribution structure on the encapsulant, the second redistribution structure connected to the first redistribution structure through the conductive vias of the substrate.

2. The method of claim 1, wherein reflowing the first conductive connectors and the second conductive connectors comprises:
   simultaneously reflowing the first conductive connectors and the second conductive connectors to simultaneously bond the substrate and the integrated circuit die to the first redistribution structure.

3. The method of claim 1 further comprising:
   forming second openings in the encapsulant; and
   dispensing conductive paste in the second openings.

4. The method of claim 3, wherein forming the second redistribution structure comprises:
   forming a bottom dielectric layer on the conductive paste and the encapsulant;
   planarizing the bottom dielectric layer; and
   forming a metallization pattern extending along and through the bottom dielectric layer.

5. A method comprising:
connecting a ring-shaped substrate to a first redistribution structure, the ring-shaped substrate comprising:
a core having a cavity;
first conductive vias extending through the core; and
conductive lines on the core, the conductive lines connected to the first conductive vias;
connecting a first integrated circuit die to the first redistribution structure, the first integrated circuit die disposed in the cavity of the ring-shaped substrate;
encapsulating the ring-shaped substrate and the first integrated circuit die with an encapsulant;
forming a second redistribution structure on the encapsulant, the second redistribution structure connected to the first redistribution structure through the first conductive vias and the conductive lines of the ring-shaped substrate;
connecting second integrated circuit dies to the second redistribution structure; and
connecting a package substrate to the first redistribution structure.

6. The method of claim 5 further comprising:
patterning openings in the encapsulant exposing the conductive lines of the ring-shaped substrate; and
filling the openings with a conductive paste to form second conductive vias, the second redistribution structure connected to the second conductive vias.

7. The method of claim 6, wherein forming the second redistribution structure comprises:
depositing a first dielectric layer on the encapsulant and the second conductive vias;
planarizing the first dielectric layer, the first dielectric layer having a first thickness after the planarizing;
forming a metallization pattern extending along and through the first dielectric layer; and
depositing a second dielectric layer on the metallization pattern and the first dielectric layer, the second dielectric layer having a second thickness, the second thickness being less than the first thickness.

8. The method of claim 5, wherein the first integrated circuit die is connected to the first redistribution structure before the ring-shaped substrate is connected to the first redistribution structure.

9. The method of claim 5, wherein the first integrated circuit die is connected to the first redistribution structure after the ring-shaped substrate is connected to the first redistribution structure.

10. The method of claim 5, wherein the ring-shaped substrate further comprises conductive connectors, and connecting the ring-shaped substrate to the first redistribution structure comprises:
reflowing the conductive connectors to connect an under bump metallurgy (UBM) of the first redistribution structure to one of the conductive lines of the ring-shaped substrate.

11. The method of claim 10 further comprising:
forming an underfill between the ring-shaped substrate and the first redistribution structure, the underfill surrounding the conductive connectors.

12. The method of claim 5, wherein after forming the second redistribution structure, a first portion of the encapsulant is disposed between the second redistribution structure and the first integrated circuit die, and a second portion of the encapsulant is disposed between the second redistribution structure and the ring-shaped substrate, the second portion being thicker than the first portion.

13. The method of claim 5, wherein the ring-shaped substrate and the first integrated circuit die are encapsulated after connecting the ring-shaped substrate and the first integrated circuit die to the first redistribution structure.

14. A method comprising:
forming a first redistribution structure comprising under bump metallurgies (UBMs), a first subset of the UBMs disposed around a second subset of the UBMs, each of the first subset of the UBMs having a first width, each of the second subset of the UBMs having a second width, the first width being greater than the second width;
connecting a ring-shaped substrate to the first subset of the UBMs, the ring-shaped substrate comprising a core and conductive vias extending through the core;
connecting a first integrated circuit die to the second subset of the UBMs;
encapsulating the first integrated circuit die and the ring-shaped substrate with an encapsulant; and
forming a second redistribution structure on the encapsulant, the second redistribution structure connected to the first redistribution structure through the conductive vias of the ring-shaped substrate.

15. The method of claim 14, wherein after forming the second redistribution structure, a first portion of the encapsulant is disposed between the second redistribution structure and the ring-shaped substrate, and a second portion of the encapsulant extends through a center of the ring-shaped substrate.

16. The method of claim 15 further comprising:
drilling openings in the first portion of the encapsulant, the openings exposing the ring-shaped substrate; and
forming conductive connectors in the openings, the second redistribution structure being formed on the conductive connectors and the encapsulant.

17. The method of claim 16, wherein forming the second redistribution structure comprises:
depositing a first dielectric layer on the encapsulant and the conductive connectors;
planarizing the first dielectric layer, a top surface of the first dielectric layer having a higher degree of planarity than a bottom surface of the first dielectric layer after the planarizing;
forming a metallization pattern extending along and through the first dielectric layer; and
depositing a second dielectric layer on the metallization pattern and the first dielectric layer, the first dielectric layer being thicker than the second dielectric layer.

18. The method of claim 15, wherein after forming the second redistribution structure, a third portion of the encapsulant is disposed between the second redistribution structure and the first integrated circuit die, the first portion of the encapsulant being thicker than the third portion of the encapsulant.

19. The method of claim 14 further comprising:
forming an underfill having a first portion and a second portion, the first portion disposed between the ring-shaped substrate and the first redistribution structure, the second portion disposed between the first integrated circuit die and the first redistribution structure.

20. The method of claim 14 further comprising:
connecting second integrated circuit dies to the second redistribution structure; and
connecting a package substrate to the first redistribution structure.

* * * * *